United States Patent [19]

Stahlecker et al.

[11] Patent Number: 5,320,781
[45] Date of Patent: Jun. 14, 1994

[54] CONDUCTIVE PIGMENT

[75] Inventors: Otto Stahlecker, Darmstadt; Manfred Thon, Pfungstadt; Ralf Glausch, Darmstadt; Gerhard Pfaff, Munster; Manfred Kieser, Darmstadt; Wilhelm Göbel, Gross Bieberau, all of Fed. Rep. of Germany

[73] Assignee: Merck Patent Gesellschaft mit Beschrankter Haftung, Darmstadt, Fed. Rep. of Germany

[21] Appl. No.: 47,083

[22] Filed: Apr. 16, 1993

[30] Foreign Application Priority Data

Apr. 18, 1992 [DE] Fed. Rep. of Germany ....... 4212950
Nov. 11, 1992 [DE] Fed. Rep. of Germany ....... 4237990

[51] Int. Cl.$^5$ .............................. C04B 14/00
[52] U.S. Cl. .................... 252/518; 106/415; 106/417; 106/419; 106/436; 106/441; 106/442; 106/455; 252/512; 428/403
[58] Field of Search ............... 106/417, 415, 419, 436, 106/441, 442, 455; 428/403; 252/512, 518

[56] References Cited

U.S. PATENT DOCUMENTS

| | | | |
|---|---|---|---|
| 3,087,828 | 4/1963 | Linton | 106/291 |
| 3,087,829 | 4/1963 | Linton | 106/291 |
| 3,716,389 | 2/1973 | Voskuil et al. | 106/444 |
| 4,038,099 | 7/1977 | DeLuca, Jr. et al. | 106/441 |
| 4,086,100 | 4/1978 | Esselborn et al. | 106/441 |
| 4,373,013 | 2/1983 | Yoshizumi | 106/441 |
| 4,404,254 | 9/1983 | Franz et al. | 428/329 |
| 4,457,784 | 7/1984 | Bernhard | 106/441 |
| 4,565,581 | 1/1986 | Bernhard | 106/441 |
| 4,568,609 | 2/1986 | Sato et al. | 428/403 |
| 4,780,140 | 10/1988 | Franz et al. | 106/20 |
| 4,826,537 | 5/1989 | Ostertag | 106/459 |
| 4,867,793 | 9/1989 | Franz et al. | 106/415 |
| 4,867,795 | 9/1989 | Ostertag et al. | 106/459 |
| 4,880,703 | 11/1989 | Sakamoto et al. | 106/441 |

Primary Examiner—Mark L. Bell
Assistant Examiner—Willie J. Thompson
Attorney, Agent, or Firm—Millen, White, Zelano & Branigan

[57] ABSTRACT

There is disclosed an electrically conductive pigment containing 20 to 95% by weight of a component A comprising one or more conductive platelet-like pigments and 5 to 80% by weight of a component B comprising one or more conductive needle-shaped or fibrous pigments.

18 Claims, No Drawings

CONDUCTIVE PIGMENT

BACKGROUND OF THE INVENTION

The invention relates to a conductive pigment containing of two or more components and having particles of different shapes.

Electrically conductive pigments are today used in many sectors, for example for preparing antistatic coatings for electronic instruments, antistatic floor coverings, antistatic finishes for explosion-protected rooms or electrically conductive basecoats for the coating of plastics.

Currently carbon black and graphite are used for the preparation of dark conductive pigments and nickel-coated graphite, metal platelets and mixed oxides, such as, for example, antimony-doped tin dioxide, for the preparation of light-colored pigments. The mixed oxides mentioned can also be present as a coating on base materials, for example mica or barium sulphate.

However, owing to their high light absorption in the visible region of the spectrum, carbon black and graphite cannot be used for transparent or colored coatings. A further problem is the strong absorption in the IR region, which, for example on irradiation by sunlight, leads to heating of the coated articles which in many cases is undesirable. Metal platelets are susceptible to corrosion and can give rise to the formation of hydrogen in aqueous formulations.

The previously used inorganic oxides or mixed oxides in the form of platelets, for example using mica as the base material, or in a form in which their dimensions along the three directions of space are about the same, for example support-free antimony-doped tin oxide, must, due to their geometrical shape, be used in high concentrations in order to show a substantial effect.

It is known to increase the conductivity of pigments based on inorganic oxides by applying an intermediate layer between the metal oxide film and the conductive layer. In EP 0,373,575, conductive platelet-like pigments are described which comprise a platelet-like (i.e. platelet-shaped) substrate covered with a metal oxide film or of a platelet-like metal oxide. They are coated with an electrically conductive layer of antimony-doped tin dioxide, a silica layer being arranged between the metal oxide film and the conductive layer in order to increase the conductivity. The resistivity of these pigments is more than a power of ten less, and thus the electrical conductivity correspondingly higher, compared with comparison pigments without a silica intermediate layer.

However, application of an additional layer to the pigment constitutes a substantial additional expenditure during preparation, thus making the product more expensive. Furthermore, the conductivity values of the pigment do not meet high requirements.

SUMMARY OF THE INVENTION

An object of the invention is to provide pigments by which the conductivity of polymer systems, such as, for example, plastics, lacquers or printing inks, can be increased.

According to the invention, these objects are achieved by a pigment comprising 5–95% by weight, preferably 20 to 80% by weight, of a component A which comprises one or more conducting, platelet-shaped pigments and 5 to 95% by weight, preferably 20 to 80% by weight, of a component B which comprises one or more conducting, non-platelet-shaped pigments.

The invention furthermore relates to lacquers, printing inks, plastics or coatings pigmented with the pigment according to the invention. The amount of pigment is 1 to 80% by weight, preferably more than 2% by weight, relative to the total solids content of the system used.

Platelet-like conductive pigments of component A are pigments based on platelet-like base materials such as mica, kaolin, talc, other sheet silicates or glass platelets provided with a conductive coating. On the other hand, they can also be platelet-like pigments produced on a continuous belt in accordance with the International Application PCT/EP92/02351.

Nonplatelet-like pigments of component B are generally pigments containing needle-shaped or fibrous base materials such as glass fibers alumina fibers or titanium dioxide fibers likewise coated with a conductive layer.

In principle, carbon fibres are also suitable, although in this case no additional conductive coatings are necessary since the fibers already have sufficient conductivity. Needle-shaped, fibrous particles are preferably particles whose length/diameter ratio is greater than about 5.

The non-platelet-shaped pigments of component Balso include the pigments whose individual particles have approximately identical dimensions along all three directions in space. They can be, for example, spherical or cube-shaped. Their aspect ratio is preferably less than about 3. These pigments are either free of supports or the metal oxides have been deposited on supports, for example on hollow spheres or barium sulphate particles. The supports used can also be finely milled mica, kaolin or talc which no longer have a platelet structure.

In principle, any platelet-like effect pigments can be used as platelet-like base materials, such as, for example, platelet-like iron oxide, bismuth oxychloride or platelet-like materials coated with coloured or colourless metal oxides, such as, for example, natural or synthetic mica, other sheet silicates such as talc, kaolin or sericite or glass platelets. All these pigments are known and commercially available or can be prepared by known methods.

The preferred base material is mica flakes coated with metal oxides, such as disclosed, for example, in U.S. Pat. No. 3,087,828 and U.S. Pat. No. 3,087,829. The metal oxides used are not only colorless highly refractive metal oxides such as, in particular, titanium oxide and/or zirconium dioxide but also colored metal oxides such as, for example, chromium oxide, nickel oxide, copper oxide, cobalt oxide and, in particular, iron oxides such as, for example, $Fe_2O_3$ or $Fe_3O_4$ or mixtures of such metal oxides. Metal oxide/mica pigments of this type are commercially available under the trade names Afflair ® and Iriodin ® (product of E. Merck, Darmstadt).

In addition, suitable platelet-like substrates are also platelet-like iron oxides such as, for example, disclosed in EP-A 14, 382 (corresponding to U.S. Pat. No. 4,404,254) EP-A 68,311, EP-A 265,820 (corresponding to U.S. Pat. No. 4,826,537) EP-A 268,072 (corresponding to U.S. Pat. No. 4,780,140), and EP-A 283,852.2.

The conducting component of the pigment comprises one or more metal oxides, metals or other inherently conducting compounds, for example polyacetylene.

Systems which are suitable as the conductive layer are, in particular, antimony-doped tin oxide, aluminiumdoped zinc oxide or fluorine-doped tin oxide or fluorine-doped titanium oxide.

The coatings mentioned make it possible to obtain light-colored conductive pigments. Furthermore, many other conductive coatings, leading to darker conductive pigments, are possible by using, for example, lower titanium oxides, iron oxide or metal particles.

The conductive layer is applied in a manner known per se, for example using the methods described in EP-A 139,557 (corresponding to U.S. Pat. No. 4,568,609). In this procedure, any customary conductive metal oxides or metal oxide mixtures can be used. A selection of such material is given in EP-A 139,557 on page 5, lines 5-19. However, preference is given to a conductive layer of antimony-doped tin dioxide applied in an amount of 25-100% by weight, relative to the platelet-like substrate, in particular in an amount of 50-75% by weight.

When an aluminum-doped zinc oxide layer is used, the proportion of the conductive layer is preferably 40 to 200% by weight, relative to the base material, and more preferably 100 to 200% by weight are used.

Larger amounts are in principle also possible, but this does not lead to further increase in conductivity and the pigments become increasingly darker.

In the layer, a tin/antimony ratio of preferably 2:1 to 20:1, more preferably 5:1 to 10:1, is maintained. If the antimony content is too low, it is not possible to achieve high conductivities, while the pigments become increasingly darker if the antimony content is elevated.

The desired homogeneous distribution of tin and antimony in the conductive layer can be achieved without difficulty by metering the tin and antimony salts, for example the chlorides, either jointly in one solution or in two separate solutions, continuously and in a predetermined mixing ratio into the aqueous suspension of the substrate coated with silica at a suitable pH of 1 to 5 and a suitable temperature of 50° to 90° C. in such a manner that in each case hydrolysis and deposition on the platelet-like substrate takes place immediately.

After coating is complete, the pigments are separated off from the suspension, and, if desired, washed and dried and, as a rule, calcined at temperatures in the range from 300° to 900° C., preferably at 650° to 850° C. Depending on the selection of the starting material, the conductive pigments according to the invention have a silvery white color or a powder and/or interference colour. The particle size of the pigments according to the invention is also determined by the selection of the starting material and is usually selected such that it is in the range of 1-200 μm, in particular about 5-100 μm.

Conductive platelet-like pigments to be classified under component A of the pigment according to the invention are commercially available under the name Minatec ® (products of E. MERCK, Darmstadt). A product sold under the trade name Minatec ® CM 31 consists of mica flakes coated with antimony-doped tin dioxide. A conductive pigment consisting of mica coated with titanium dioxide and containing an antimony-doped tin dioxide layer as the conductive layer is sold under the name Minatec ® CM 30.

Conducting, ball-shaped pigments which may be used as component B of the pigment according to the invention are likewise sold as commercial products. A pigment comprising barium sulphate coated with antimony-doped tin oxide is offered by Sachtleben Chemie GmbH, Duisburg under the trade name Sacon ® p 401. A tin (IV) oxide pigment is prepared by Goldschmidt AG, Duisburg under the trade name Tego-Conduct S. Finally, a conducting pigment comprising amorphous silica and a coating of antimony-doped tin dioxide is prepared by Du Pont under the name Zelec ® ECP-S.

Conductive needle-shaped or fibrous pigments to be classified under component B of the pigment according to the invention are not yet sold as commercial products.

However, coating of the needle-shaped or fibrous base material takes place according to known processes such as mentioned above for platelet-like base materials.

The pigment is prepared by mixing components A and B by known processes, it being possible for component A to comprise one or more platelet-shaped pigments and component B to comprise one or more non-platelet-shaped pigments. Both components can be present in the pigment preparation in an amount of 5 to 95% by weight, preferably 20 to 80% by weight.

The concentration of the pigment in the system to be pigmented, for example in a lacquer, is between 1 and 80% by weight, preferably more than 2% by weight, relative to the total solids content of the system.

It has proven advantageous to mix the base materials of components A and B with one another before applying the conductive layer.

A mixture of two separately prepared conductive pigments, one based on platelets and the other based on needles or fibres, does not lead to the same favourable result as is obtained by joint coating, since the conductive layer becomes damaged during the mixing process, thus adversely affecting the conductivity. Secondly, the homogeneous coatings and distributions of the platelet-like and needle-shaped or fiber-shaped components necessary for very high conductivities are obtained most preferentially if coating is carried out with a mixture.

The pigments according to the invention have the advantage of being both conductive and light-coloured. By virtue of this fact, they have a much broader area of application compared with the darker carbon-black pigments.

The combination of conductive platelet-like and needle-shaped particles leads to conductive products whose electrical properties are better than those of a pigment consisting of pure conductive platelets, balls or fibers. The advantage of these "combination pigments" can be clearly seen in particular in the application system, in particular when incorporated into plastic. The concentrations required of the conductive pigment in the plastic (pigment volume concentration) are noticeably lower than in the case of conventional pigments. This is advantageous not only in terms of price but also in terms of the properties of the application system, since the properties of the plastic are actually maintained better if less pigment has to be incorporated. Particularly the use of fibrous particles often also results in additional stabilization of the mechanical properties of the plastic.

Without further elaboration, it is believed that one skilled in the art can, using the preceding description, utilize the present invention to its fullest extent. The preferred specific embodiments are, therefore, to be construed as merely illustrative, and not limitative of the disclosure in any way whatsoever.

The entire disclosure of all applications, patents and publications, cited above and below, and of corresponding German Nos. P 42 12 950 and P 42 37 990, are hereby incorporated by reference.

EXAMPLES

The conductivity of individual pigment preparations was tested using an acrylic melamine resin lacquer system. The individual pigment preparations were prepared by mixing the platelet-shaped pigment Minatec ® CM 30 (component A) with one each of the non-platelet-shaped pigments Sacon ® p 401, Tego-Conduct S and Zelec ® ECP-S, and the mixture was incorporated in the lacquer system. The lacquer obtained was spray-coated onto a test panel and dried. The surface resistance was then measured by DIN 53596 using a flexible-tongue electrode. At a pigment content of 15% by weight in the lacquer system, the following conductivities, which are shown in Table 1, were found for the 4 pigments:

TABLE 1

| Pigment | Component | Conductivity | |
|---|---|---|---|
| Minatec ® CM 30 | A | 6.5 | k$\Omega$ |
| Zelec ® ECP-S | B | 365 | k$\Omega$ |
| Sacon ® p 401 | B | 4.5 | k$\Omega$ |
| Tego-Conduct S | B | 400 | G$\Omega$ |

EXAMPLE 1

Minatec ® CM 30 (component A) and Zelec ® ECP-S (component B) were incorporated in the lacquer system in amounts of 5%, 7.5% and 10%. After application to a test panel, the surface resistance was measured. The results are shown in Table 2.

TABLE 2

| Pigment content in the lacquer system | Conductivity |
|---|---|
| 5% of Minatec/10% of Zelec | 7.9 ± 0.1 k$\Omega$ |
| 7.5% of Minatec/7.5% of Zelec | 1550 ± 10 $\Omega$ |
| 10% of Minatec/5% of Zelec | 1280 ± 10 $\Omega$ |

EXAMPLE 2

Minatec ® CM 30 (component A) and Sacon ® p 401 (component B) were incorporated in the lacquer system in amounts of 5%, 7.5% and 10%. After application, the surface resistance was measured. The results are shown in Table 3.

TABLE 3

| Pigment content in the lacquer system | Conductivity |
|---|---|
| 5% of Minatec/10% of Sacon | 330 ± 10 $\Omega$ |
| 7.5% of Minatec/7.5% of Sacon | 260 ± 10 $\Omega$ |
| 10% of Minatec/5% of Sacon | 250 ± 10 $\Omega$ |

A comparison of the results from Tables 2 and 3 with the results from Table 1 shows that the pigment preparations according to the invention have a significantly improved electrical conductivity compared with the individual components. The electrical conductivity is improved by about one power of ten.

EXAMPLE 3

Minatec ® CM 30 (component A) and Tego-Conduct S were incorporated in the lacquer system in amounts of 5%, 7.5% and 10%. After application, the surface resistance was measured. The results are shown in Table 4.

TABLE 4

| Pigment content in the lacquer system | Conductivity |
|---|---|
| 5% of Minatec/10% of Tego | 303 k$\Omega$ |
| 7.5% of Minatec/7.5% of Tego | 35.5 ± 0.1 k$\Omega$ |
| 10% of Minatec/5% of Tego | 17.0 ± 0.1 k$\Omega$ |

By admixing Minatec CM 30, the conductivity of the pigment Tego-Conduct S, which, at a resistance of 400 G$\Omega$, is virtually zero, is significantly increased.

EXAMPLE 4

50 g of mica (particle size < 15 μm) and 50 g of glass fibres (type FG 4 10/030 STW Schwarzwälder Textilwerke) are suspended in 1900 ml of fully deionized water, the resulting slurry is heated to 75° C., and 500 ml of a hydrochloric acid solution containing 148 g of SnCl$_4$ × 5 H$_2$O, 17 g of SbCl$_3$ and 70 ml of conc. HCl are continuously added with stirring over a period of 4 hours. During the entire reaction time, the pH is kept constant at 2.1 by means of 20% sodium hydroxide solution. At the end of the reaction, stirring is continued for 30 minutes and the mixture is then allowed to settle for 10 hours. The solid is filtered off, washed with about 20 l of water until free of chloride and dried at 110° C.

The product thus obtained is calcined in air at 800° C. for 30 minutes. This gives a light-colored pigment having a powder resistance of 39 ohm × cm.

In order to measure the resistivity of the pigment, about 0.5 g of pigment are compacted in an acrylic glass tube of diameter 2 cm between two metal stamps by means of a 10 kg weight. The electrical resistance R of the pigment thus compacted is then measured. The resistivity S is obtained from the layer thickness L of the compressed pigment by the relationship $$S = R \cdot \frac{\pi \cdot (d/2)^2}{L} \text{ [ohm} \cdot \text{cm]}$$

Measurement of the resistance of the pigment calcined at 800° C. in plasticised PVC gives the following values:

| at 40% by weight of pigment in PVC | 2 × 10$^5$ ohm |
|---|---|
| at 35% by weight of pigment in PVC | 5 × 10$^6$ ohm |
| at 30% by weight of pigment in PVC | 5 × 10$^7$ ohm |

Upon incorporation of the individual components in PVC, the conductivities measured are much worse. The resistivity values are approximately 10$^5$ ohm higher than in a mixture of both components. When the pure platelet-like mica-based pigment particles were used in a concentration of 30% by weight in PVC, the resistance measured was 1 × 10$^{12}$ ohm. When the purely needle-shaped pigment particles based on glass fibers were used in a concentration of 40% by weight in PVC, the resistance measured was 7 × 10$^{12}$ ohm.

EXAMPLE 5

75 g of mica (particle size < 15 μm) and 25 g of glass fibres (type FG 4 10/030 STW Schwarzwälder Textilwerke) are suspended in 1900 ml of fully deionized water, the resulting slurry is heated to 75° C., and 500 ml of a hydrochloric acid solution containing 148 g of SnCl$_4$ × 5 H$_2$O, 17 g of SbCl$_3$ and 70 ml of conc. HCl are continuously added with stirring over a period of 4 hours. During the entire reaction time, the pH is kept constant at 2.1 by means of 20% sodium hydroxide solution. At the end of the reaction, stirring is continued for 30 minutes and the mixture is then allowed to settle for 10 hours. The solid is filtered off, washed with about 20 l of water until free of chloride and dried at 110° C. The product thus obtained is calcined in air at 800° C. for 30 minutes. This gives a light-colored pigment having a powder resistance of 26 ohm×cm. After incorporation in plasticized PVC, a resistance of $4 \times 10^4$ ohm was measured at a concentration of 35% by weight of pigment in PVC.

EXAMPLE 6

75 g of mica (particle size<15 μm) and 75 g of glass fibers (type FG 410/030 STW Schwarzwälder Textilwerke) are suspended in 1900 ml of fully deionized water, the resulting slurry is heated to 75° C., and 500 ml of a hydrochloric acid solution containing 148 g of $SnCl_4 \times 5\ H_2O$, 17 g of $SbCl_3$ and 70 ml of conc. HCl are continuously added with stirring over a period of 4 hours. During the entire reaction time, the pH is kept constant at 2.1 by means of 20% sodium hydroxide solution. At the end of the reaction, stirring is continued for 30 minutes and the mixture is then allowed to settle for 10 hours. The solid is filtered off, washed with abut 20 l of water until free of chloride and dried at 110° C. The product thus obtained is calcined in air at 800° C. for 30 minutes. This gives a light-colored pigment having a powder resistance of 40 ohm×cm. After incorporation in plasticized PVC, a resistance of $5 \times 10^8$ ohm was measured at a concentration of 35% by weight of pigment in PVC.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modification of the invention to adapt it to various usages and conditions.

We claim:

1. An electroconductive pigment comprising 5 to 95% by weight of a component A which comprises at least one electroconductive platelet-shaped pigment, and 5% to 95% by weight of a component B which comprises at least one electroconductive non-platelet-shaped pigment.

2. A pigment according to claim 1, wherein the platelet-shaped pigment of component A comprises (a) a platelet-shaped support optionally coated with at least one metal oxide, (b) a platelet-shaped metal oxide, each of (a) and (b) being coated with a conductive layer, or (c) a conductive platelet-shaped metal oxide.

3. A pigment according to claim 1, wherein the conductive layer is a metal oxide doped with a metal or with a halogen, is an inherently conductive compound or metal.

4. A pigment according to claim 3, wherein the conductive layer is antimony doped tin oxide, aluminum doped zinc oxide, fluorine doped tin oxide or fluorine doped titanium oxide.

5. A pigment according to claim 1 wherein the pigment of component B comprises particles having approximately identical dimensions along all three directions in space.

6. A pigment according to claim 5, wherein the particles are cubes or spheres.

7. A pigment according to claim 1, wherein the pigment of component B is (a) at least one non-platelet-shaped metal oxide, (b) is a non-platelet-shaped support coated with at least one metal oxide, each of (a) and (b) being coated with a conductive layer, or is (c) a conductive non-platelet-shaped metal oxide.

8. A pigment according to claim 7, wherein the conductive layer is a metal oxide doped with a metal or with a halogen, is an inherently conductive compound or metal.

9. A pigment according to claim 8, wherein the conductive layer is antimony doped tin oxide, aluminum doped zinc oxide, fluorine doped tin oxide or fluorine doped titanium oxide.

10. A pigment according to claim 7, wherein component B contains at least one needle-shaped or fibrous pigment.

11. A pigment according to claim 2, wherein the support is mica, talc, kaolin or glass.

12. A pigment according to claim 1, wherein component A is a nacreous pigment.

13. A pigment according to claim 7, wherein the support is particles of barium sulfate, mica, kaolin or talc, or fibers of glass alumina or titanium dioxide.

14. A pigment according to claim 1, wherein component B is carbon fibers.

15. A process for the preparation of a pigment according to claim 1, comprising mixing platelet-like and non-platelet-like base materials, optionally coating said materials with metal oxide and coating said materials with a doped metal oxide or inherently conductive compound.

16. In a paint, printing ink, plastic system or coating pigmented with a conductive pigment, the improvement wherein the pigment is one according to claim 1.

17. A pigment according to claim 1, comprising at least 50% by weight of the platelet-shaped pigment.

18. In a paint, printing ink, plastic system or coating pigmented with a conductive pigment, the improvement wherein the pigment is one according to claim 17.

* * * * *